United States Patent
Shen et al.

(10) Patent No.: US 9,773,755 B2
(45) Date of Patent: Sep. 26, 2017

(54) SUBSTRATE INTERCONNECTIONS HAVING DIFFERENT SIZES

(71) Applicant: Taiwan Semiconductor Manufacturing Company, Ltd., Hsin-Chu (TW)

(72) Inventors: Wen-Wei Shen, Xinzhuang (TW); Ying-Ching Shih, Hsin-Chu (TW); Chen-Shien Chen, Zhubei (TW); Ming-Fa Chen, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/860,362

(22) Filed: Sep. 21, 2015

(65) Prior Publication Data
US 2016/0013162 A1    Jan. 14, 2016

Related U.S. Application Data

(63) Continuation of application No. 12/784,266, filed on May 20, 2010, now Pat. No. 9,142,533.

(51) Int. Cl.
*H01L 25/00* (2006.01)
*H01L 25/065* (2006.01)
(Continued)

(52) U.S. Cl.
CPC ........ *H01L 25/0657* (2013.01); *H01L 21/486* (2013.01); *H01L 23/49811* (2013.01);
(Continued)

(58) Field of Classification Search
CPC .......................... H01L 23/525; H01L 31/0508
See application file for complete search history.

(56) References Cited

U.S. PATENT DOCUMENTS 4,258,382 A * 3/1981 Harris ..................... H01L 24/10
257/737
4,536,421 A * 8/1985 Matsuzawa ........... G03F 7/0125
427/282
(Continued)

FOREIGN PATENT DOCUMENTS

CN    101080138        11/2007
CN    101188219 A       5/2008
(Continued)

OTHER PUBLICATIONS

Garrou, Phil, "IFTLE 58 Fine Pitch Microjoints, Cu Pillar Bump-on-Lead, Xillinx Interposer Reliability," Solid State Technology, Insights for Electronic Manufacturing, Jul. 18, 2011, 3 pages.

*Primary Examiner* — Caridad Everhart
*Assistant Examiner* — Ankush Singal
(74) *Attorney, Agent, or Firm* — Slater Matsil, LLP

(57) ABSTRACT

A bump structure that may be used to interconnect one substrate to another substrate is provided. A conductive pillar is formed on a first substrate such that the conductive pillar has a width different than a contact surface on a second substrate. In an embodiment the conductive pillar of the first substrate has a trapezoidal shape or a shape having tapered sidewalls, thereby providing a conductive pillar having base portion wider than a tip portion. The substrates may each be an integrated circuit die, an interposer, a printed circuit board, a high-density interconnect, or the like.

20 Claims, 8 Drawing Sheets

(51) Int. Cl.
*H01L 23/00* (2006.01)
*H01L 23/498* (2006.01)
*H01L 21/48* (2006.01)
*H01L 23/538* (2006.01)
*H01L 23/31* (2006.01)

(52) U.S. Cl.
CPC .. *H01L 23/49827* (2013.01); *H01L 23/49838* (2013.01); *H01L 23/5384* (2013.01); *H01L 24/03* (2013.01); *H01L 24/09* (2013.01); *H01L 24/11* (2013.01); *H01L 24/13* (2013.01); *H01L 24/14* (2013.01); *H01L 24/17* (2013.01); *H01L 24/81* (2013.01); *H01L 25/0655* (2013.01); *H01L 25/50* (2013.01); *H01L 23/3114* (2013.01); *H01L 23/3192* (2013.01); *H01L 24/05* (2013.01); *H01L 24/16* (2013.01); *H01L 24/73* (2013.01); *H01L 2224/0345* (2013.01); *H01L 2224/0381* (2013.01); *H01L 2224/03452* (2013.01); *H01L 2224/03831* (2013.01); *H01L 2224/0401* (2013.01); *H01L 2224/0557* (2013.01); *H01L 2224/05572* (2013.01); *H01L 2224/05647* (2013.01); *H01L 2224/05666* (2013.01); *H01L 2224/05681* (2013.01); *H01L 2224/1145* (2013.01); *H01L 2224/1162* (2013.01); *H01L 2224/1181* (2013.01); *H01L 2224/11452* (2013.01); *H01L 2224/11462* (2013.01); *H01L 2224/11464* (2013.01); *H01L 2224/11472* (2013.01); *H01L 2224/11622* (2013.01); *H01L 2224/11849* (2013.01); *H01L 2224/11903* (2013.01); *H01L 2224/13016* (2013.01); *H01L 2224/13025* (2013.01); *H01L 2224/1354* (2013.01); *H01L 2224/13084* (2013.01); *H01L 2224/13111* (2013.01); *H01L 2224/13116* (2013.01); *H01L 2224/13139* (2013.01); *H01L 2224/13144* (2013.01); *H01L 2224/13155* (2013.01); *H01L 2224/13169* (2013.01); *H01L 2224/1403* (2013.01); *H01L 2224/14181* (2013.01); *H01L 2224/16145* (2013.01); *H01L 2224/16146* (2013.01); *H01L 2224/16225* (2013.01); *H01L 2224/16227* (2013.01); *H01L 2224/73204* (2013.01); *H01L 2224/81193* (2013.01); *H01L 2225/06513* (2013.01); *H01L 2225/06517* (2013.01); *H01L 2225/06541* (2013.01); *H01L 2225/06548* (2013.01); *H01L 2225/06568* (2013.01); *H01L 2924/0002* (2013.01); *H01L 2924/014* (2013.01); *H01L 2924/0105* (2013.01); *H01L 2924/01006* (2013.01); *H01L 2924/01013* (2013.01); *H01L 2924/01019* (2013.01); *H01L 2924/01029* (2013.01); *H01L 2924/01033* (2013.01); *H01L 2924/01047* (2013.01); *H01L 2924/01073* (2013.01); *H01L 2924/01074* (2013.01); *H01L 2924/01075* (2013.01); *H01L 2924/01078* (2013.01); *H01L 2924/01079* (2013.01); *H01L 2924/01082* (2013.01); *H01L 2924/14* (2013.01); *H01L 2924/15788* (2013.01)

(56) References Cited

U.S. PATENT DOCUMENTS

| | | | |
|---|---|---|---|
| 4,811,082 A | 3/1989 | Jacobs et al. | |
| 4,830,723 A * | 5/1989 | Galvagni | C23C 14/042 118/505 |
| 4,990,462 A | 2/1991 | Sliwa, Jr. | |
| 5,075,253 A | 12/1991 | Sliwa, Jr. | |
| 5,075,965 A | 12/1991 | Carey et al. | |
| 5,130,779 A | 7/1992 | Agarwala et al. | |
| 5,134,460 A * | 7/1992 | Brady | H01L 24/10 257/733 |
| 5,277,756 A | 1/1994 | Dion | |
| 5,334,804 A | 8/1994 | Love et al. | |
| 5,380,681 A | 1/1995 | Hsu | |
| 5,431,328 A | 7/1995 | Chang et al. | |
| 5,440,239 A | 8/1995 | Zappella et al. | |
| 5,470,787 A | 11/1995 | Greer | |
| 5,481,133 A | 1/1996 | Hsu | |
| 5,492,266 A * | 2/1996 | Hoebener | B23K 3/06 228/180.22 |
| 5,508,561 A | 4/1996 | Tago et al. | |
| 5,542,601 A | 8/1996 | Fallon et al. | |
| 5,565,379 A * | 10/1996 | Baba | H01L 24/11 257/E21.508 |
| 5,587,337 A | 12/1996 | Idaka et al. | |
| 5,680,187 A * | 10/1997 | Nagayama | G02F 1/133512 252/299.01 |
| 5,743,006 A * | 4/1998 | Beratan | G01J 5/34 228/180.22 |
| 5,790,377 A | 8/1998 | Schreiber et al. | |
| 5,796,591 A * | 8/1998 | Dalal | H01L 24/81 228/180.22 |
| 5,816,478 A | 10/1998 | Kaskoun et al. | |
| 5,889,326 A * | 3/1999 | Tanaka | H01L 24/11 257/737 |
| 5,922,496 A * | 7/1999 | Dalal | H01L 24/11 101/127 |
| 5,977,599 A | 11/1999 | Adrian | |
| 6,002,172 A | 12/1999 | Desai et al. | |
| 6,002,177 A | 12/1999 | Gsynes et al. | |
| 6,025,650 A | 2/2000 | Tsuji et al. | |
| 6,051,273 A * | 4/2000 | Dalal | B23K 3/0623 228/180.22 |
| 6,082,610 A | 7/2000 | Shangguan et al. | |
| 6,091,141 A | 7/2000 | Heo | |
| 6,099,935 A * | 8/2000 | Brearley | H01L 21/6835 228/180.1 |
| 6,130,476 A * | 10/2000 | LaFontaine, Jr. | H01L 23/49811 257/666 |
| 6,137,184 A | 10/2000 | Ikegami | |
| 6,181,010 B1 | 1/2001 | Nozawa | |
| 6,187,678 B1 | 2/2001 | Gaynes et al. | |
| 6,229,216 B1 | 5/2001 | Ma et al. | |
| 6,229,220 B1 | 5/2001 | Saitoh et al. | |
| 6,236,115 B1 | 5/2001 | Gaynes et al. | |
| 6,249,051 B1 | 6/2001 | Chang et al. | |
| 6,250,541 B1 | 6/2001 | Shangguan et al. | |
| 6,259,159 B1 * | 7/2001 | Dalal | H01L 21/0331 257/738 |
| 6,271,059 B1 | 8/2001 | Bertin et al. | |
| 6,279,815 B1 | 8/2001 | Correia et al. | |
| 6,291,891 B1 | 9/2001 | Higashi et al. | |
| 6,336,262 B1 * | 1/2002 | Dalal | H01L 21/563 228/180.21 |
| 6,344,234 B1 * | 2/2002 | Dalal | H01L 21/4853 205/125 |
| 6,346,469 B1 * | 2/2002 | Greer | H01L 24/03 257/772 |
| 6,355,501 B1 | 3/2002 | Fung et al. | |
| 6,358,847 B1 | 3/2002 | Li et al. | |
| 6,388,322 B1 * | 5/2002 | Goossen | H01L 21/6835 257/737 |
| 6,424,037 B1 | 7/2002 | Ho et al. | |
| 6,426,556 B1 * | 7/2002 | Lin | H01L 24/03 257/738 |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,469,394 B1 * | 10/2002 | Wong | H01L 23/49811 257/778 |
| 6,475,897 B1 * | 11/2002 | Hosaka | H01L 24/11 228/180.22 |
| 6,476,503 B1 | 11/2002 | Imamura et al. | |
| 6,492,197 B1 | 12/2002 | Rinne | |

(56) References Cited

U.S. PATENT DOCUMENTS

| | | |
|---|---|---|
| 6,498,308 B2 | 12/2002 | Sakamoto |
| 6,562,653 B1 | 5/2003 | Ma et al. |
| 6,562,657 B1 | 5/2003 | Lin |
| 6,570,248 B1 | 5/2003 | Ahn et al. |
| 6,573,598 B2 | 6/2003 | Ohuchi et al. |
| 6,578,754 B1 | 6/2003 | Tung |
| 6,583,846 B1 | 6/2003 | Yanagawa et al. |
| 6,592,019 B2 | 7/2003 | Tung |
| 6,600,222 B1 | 7/2003 | levardo |
| 6,607,938 B2 | 8/2003 | Kwon et al. |
| 6,661,085 B2 | 12/2003 | Kellar et al. |
| 6,713,844 B2 | 3/2004 | Tatsuta et al. |
| 6,731,003 B2* | 5/2004 | Joshi ............. H01L 24/11 257/737 |
| 6,762,076 B2 | 7/2004 | Kim et al. |
| 6,790,748 B2 | 9/2004 | Kim et al. |
| 6,887,769 B2 | 5/2005 | Kellar et al. |
| 6,908,565 B2 | 6/2005 | Kim et al. |
| 6,908,785 B2 | 6/2005 | Kim |
| 6,924,551 B2 | 8/2005 | Rumer et al. |
| 6,940,169 B2 | 9/2005 | Jin et al. |
| 6,940,178 B2* | 9/2005 | Kweon ............. H01L 23/49816 257/737 |
| 6,943,067 B2 | 9/2005 | Greenlaw |
| 6,946,384 B2 | 9/2005 | Kloster et al. |
| 6,972,490 B2 | 12/2005 | Chang et al. |
| 6,975,016 B2 | 12/2005 | Kellar et al. |
| 6,998,216 B2 | 2/2006 | He et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,135,766 B1 | 11/2006 | Costa et al. |
| 7,151,009 B2 | 12/2006 | Kim et al. |
| 7,157,787 B2 | 1/2007 | Kim et al. |
| 7,192,803 B1 | 3/2007 | Lin et al. |
| 7,215,033 B2 | 5/2007 | Lee et al. |
| 7,245,023 B1 | 7/2007 | Lin |
| 7,251,484 B2 | 7/2007 | Aslanian |
| 7,271,483 B2 | 9/2007 | Lin et al. |
| 7,271,484 B2 | 9/2007 | Reiss et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | William et al. |
| 7,320,928 B2 | 1/2008 | Kloster et al. |
| 7,345,350 B2 | 3/2008 | Sinha |
| 7,382,049 B2 | 6/2008 | Ho et al. |
| 7,402,442 B2 | 7/2008 | Condorelli et al. |
| 7,402,508 B2 | 7/2008 | Kaneko |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,459,785 B2 | 12/2008 | Daubenspeck et al. |
| 7,470,996 B2 | 12/2008 | Yoneyama et al. |
| 7,494,845 B2 | 2/2009 | Hwang et al. |
| 7,495,179 B2 | 2/2009 | Kubota et al. |
| 7,528,494 B2 | 5/2009 | Furukawa et al. |
| 7,531,890 B2 | 5/2009 | Kim |
| 7,554,201 B2 | 6/2009 | Kang et al. |
| 7,557,597 B2 | 7/2009 | Anderson et al. |
| 7,569,935 B1 | 8/2009 | Fan |
| 7,576,435 B2 | 8/2009 | Chao |
| 7,659,631 B2* | 2/2010 | Kamins ............. H01L 23/49827 257/775 |
| 7,804,177 B2 | 9/2010 | Lu et al. |
| 7,834,450 B2 | 11/2010 | Kang |
| 7,939,939 B1* | 5/2011 | Zeng ............. B23K 1/0016 228/180.22 |
| 7,946,331 B2 | 5/2011 | Trezza et al. |
| 8,076,232 B2* | 12/2011 | Pendse ............. H01L 21/563 257/734 |
| 8,093,729 B2 | 1/2012 | Trezza |
| 8,120,175 B2 | 2/2012 | Farooq et al. |
| 8,130,475 B2 | 3/2012 | Kawamori et al. |
| 8,158,489 B2 | 4/2012 | Huang et al. |
| 8,207,604 B2 | 6/2012 | Haba et al. |
| 8,232,640 B2 | 7/2012 | Tomoda et al. |
| 8,258,055 B2 | 9/2012 | Hwang et al. |
| 8,367,939 B2* | 2/2013 | Ishido ............. H05K 1/111 174/250 |
| 8,435,881 B2 | 5/2013 | Choi et al. |
| 8,576,368 B2 | 11/2013 | Kim et al. |
| 9,355,980 B2* | 5/2016 | Chen ............. H01L 24/16 |
| 2001/0013423 A1 | 8/2001 | Dalal et al. |
| 2001/0038147 A1 | 11/2001 | Higashi et al. |
| 2002/0033412 A1 | 3/2002 | Tung |
| 2002/0084528 A1 | 7/2002 | Kim et al. |
| 2002/0100974 A1 | 8/2002 | Uchiyama |
| 2002/0106832 A1 | 8/2002 | Hotchkiss et al. |
| 2002/0197811 A1 | 12/2002 | Sato |
| 2003/0049886 A1* | 3/2003 | Salmon ............. H01L 23/49811 438/106 |
| 2003/0092219 A1 | 5/2003 | Ohuchi et al. |
| 2003/0166331 A1* | 9/2003 | Tong ............. H01L 24/11 438/613 |
| 2003/0216025 A1* | 11/2003 | Lu ............. H01L 21/288 438/614 |
| 2003/0218250 A1 | 11/2003 | Kung et al. |
| 2004/0007779 A1 | 1/2004 | Arbuthnot et al. |
| 2004/0140538 A1 | 7/2004 | Harvey |
| 2004/0159944 A1 | 8/2004 | Datta et al. |
| 2004/0166661 A1* | 8/2004 | Lei ............. H01L 24/03 438/614 |
| 2004/0212098 A1 | 10/2004 | Pendse |
| 2004/0251546 A1* | 12/2004 | Lee ............. B23K 35/262 257/738 |
| 2005/0017376 A1* | 1/2005 | Tsai ............. H01L 24/10 257/786 |
| 2005/0062153 A1 | 3/2005 | Saito et al. |
| 2005/0158900 A1* | 7/2005 | Lee ............. G02F 1/136286 438/30 |
| 2005/0212114 A1 | 9/2005 | Kawano et al. |
| 2005/0224991 A1* | 10/2005 | Yeo ............. H01L 24/03 257/781 |
| 2005/0253264 A1 | 11/2005 | Aiba et al. |
| 2006/0012024 A1 | 1/2006 | Lin et al. |
| 2006/0017160 A1* | 1/2006 | Huang ............. H01L 24/02 257/737 |
| 2006/0038303 A1 | 2/2006 | Sterrett et al. |
| 2006/0051954 A1* | 3/2006 | Lin ............. H01L 21/4853 438/614 |
| 2006/0055032 A1 | 3/2006 | Chang et al. |
| 2006/0076677 A1 | 4/2006 | Daubenspeck et al. |
| 2006/0209245 A1 | 9/2006 | Mun et al. |
| 2006/0223313 A1 | 10/2006 | Yoon et al. |
| 2006/0279881 A1* | 12/2006 | Sato ............. G11B 5/3932 360/324.12 |
| 2006/0292824 A1 | 12/2006 | Beyne et al. |
| 2007/0001280 A1 | 1/2007 | Hua |
| 2007/0012337 A1 | 1/2007 | Hillman et al. |
| 2007/0018294 A1 | 1/2007 | Sutardja |
| 2007/0020906 A1 | 1/2007 | Chiu et al. |
| 2007/0023483 A1* | 2/2007 | Yoneyama ............. B23K 20/10 228/110.1 |
| 2007/0045840 A1 | 3/2007 | Varnau |
| 2007/0057022 A1* | 3/2007 | Mogami ............. H01L 21/563 228/101 |
| 2007/0114663 A1 | 5/2007 | Brown et al. |
| 2007/0200234 A1 | 8/2007 | Gerber et al. |
| 2008/0003402 A1 | 1/2008 | Haba et al. |
| 2008/0003715 A1* | 1/2008 | Lee ............. H01L 24/11 438/108 |
| 2008/0023850 A1 | 1/2008 | Lu et al. |
| 2008/0087998 A1* | 4/2008 | Kamins ............. H01L 23/49827 257/686 |
| 2008/0128911 A1 | 6/2008 | Koyama |
| 2008/0150135 A1 | 6/2008 | Oyama et al. |
| 2008/0194095 A1 | 8/2008 | Daubenspeck et al. |
| 2008/0217047 A1* | 9/2008 | Hu ............. H01L 23/49811 174/257 |
| 2008/0218061 A1 | 9/2008 | Chao et al. |
| 2008/0277785 A1 | 11/2008 | Hwan et al. |

(56) References Cited

U.S. PATENT DOCUMENTS

| | | |
|---|---|---|
| 2009/0025215 A1 | 1/2009 | Murakami et al. |
| 2009/0042144 A1 | 2/2009 | Kitada et al. |
| 2009/0045499 A1* | 2/2009 | Kim .................... H01L 25/0657 257/691 |
| 2009/0075469 A1 | 3/2009 | Furman et al. |
| 2009/0087143 A1* | 4/2009 | Jeon ........................ G02B 5/20 385/37 |
| 2009/0096092 A1 | 4/2009 | Patel |
| 2009/0108443 A1 | 4/2009 | Jiang |
| 2009/0146316 A1* | 6/2009 | Jadhav .............. H01L 23/49816 257/778 |
| 2009/0149016 A1 | 6/2009 | Park et al. |
| 2009/0166861 A1 | 7/2009 | Lehr et al. |
| 2009/0174067 A1 | 7/2009 | Lin |
| 2009/0218702 A1 | 9/2009 | Beyne et al. |
| 2009/0233436 A1* | 9/2009 | Kim ........................ H01L 24/11 438/614 |
| 2009/0250814 A1 | 10/2009 | Pendse et al. |
| 2010/0007019 A1 | 1/2010 | Pendse |
| 2010/0044860 A1 | 2/2010 | Haba et al. |
| 2010/0052473 A1* | 3/2010 | Kimura .................. H03H 9/059 310/313 R |
| 2010/0084763 A1 | 4/2010 | Yu |
| 2010/0141880 A1 | 6/2010 | Koito et al. |
| 2010/0193944 A1 | 8/2010 | Castro et al. |
| 2010/0200279 A1 | 8/2010 | Kariya et al. |
| 2010/0252926 A1 | 10/2010 | Kato et al. |
| 2010/0258950 A1 | 10/2010 | Li et al. |
| 2010/0270458 A1* | 10/2010 | Lake ................. H01L 21/76898 250/208.1 |
| 2010/0276787 A1 | 11/2010 | Yu et al. |
| 2010/0314745 A1 | 12/2010 | Masumoto et al. |
| 2010/0327422 A1 | 12/2010 | Lee et al. |
| 2011/0001250 A1 | 1/2011 | Lin et al. |
| 2011/0024902 A1 | 2/2011 | Lin et al. |
| 2011/0038147 A1 | 2/2011 | Lin et al. |
| 2011/0074022 A1 | 3/2011 | Pendse |
| 2011/0101526 A1* | 5/2011 | Hsiao ................ H01L 23/49816 257/738 |
| 2011/0169158 A1 | 7/2011 | Varanasi |
| 2011/0177686 A1 | 7/2011 | Zeng et al. |
| 2011/0186986 A1 | 8/2011 | Chuang et al. |
| 2011/0193220 A1 | 8/2011 | Kuo et al. |
| 2011/0244675 A1 | 10/2011 | Huang et al. |
| 2011/0248399 A1 | 10/2011 | Pendse |
| 2011/0260317 A1 | 10/2011 | Lu et al. |
| 2011/0285011 A1 | 11/2011 | Hwang et al. |
| 2011/0285023 A1 | 11/2011 | Shen et al. |
| 2012/0007230 A1 | 1/2012 | Hwang et al. |
| 2012/0007231 A1 | 1/2012 | Chang |
| 2012/0012997 A1 | 1/2012 | Shen et al. |
| 2012/0040524 A1 | 2/2012 | Kuo et al. |
| 2012/0049346 A1 | 3/2012 | Lin et al. |
| 2012/0091577 A1 | 4/2012 | Hwang et al. |
| 2012/0098120 A1 | 4/2012 | Yu et al. |
| 2012/0098124 A1 | 4/2012 | Wu et al. |
| 2012/0146168 A1 | 6/2012 | Hsieh et al. |
| 2012/0306080 A1 | 12/2012 | Yu et al. |
| 2013/0026622 A1 | 1/2013 | Chuang et al. |
| 2013/0087920 A1 | 4/2013 | Jeng et al. |
| 2013/0093079 A1 | 4/2013 | Tu et al. |
| 2013/0270699 A1 | 10/2013 | Kuo et al. |
| 2013/0277830 A1 | 10/2013 | Yu et al. |
| 2013/0288473 A1 | 10/2013 | Chuang et al. |
| 2014/0054764 A1 | 2/2014 | Lu et al. |
| 2014/0061897 A1 | 3/2014 | Lin et al. |
| 2014/0061924 A1 | 3/2014 | Chen et al. |
| 2014/0077358 A1 | 3/2014 | Chen et al. |
| 2014/0077359 A1 | 3/2014 | Tsai et al. |
| 2014/0077360 A1 | 3/2014 | Lin et al. |
| 2014/0077365 A1 | 3/2014 | Lin et al. |
| 2014/0264890 A1 | 9/2014 | Breuer et al. |
| 2014/0346669 A1 | 11/2014 | Wang et al. |
| 2014/0353820 A1 | 12/2014 | Yu et al. |

FOREIGN PATENT DOCUMENTS

| | | |
|---|---|---|
| CN | 102386158 A | 3/2012 |
| CN | 102468197 A | 5/2012 |
| KR | 1020110002816 A | 1/2011 |
| KR | 1020110128532 A | 11/2011 |
| TW | 200826265 | 6/2008 |
| TW | 200915452 | 4/2009 |
| TW | 201133662 | 10/2011 |
| TW | 201143007 | 12/2011 |
| WO | 2009140238 | 11/2009 |

\* cited by examiner

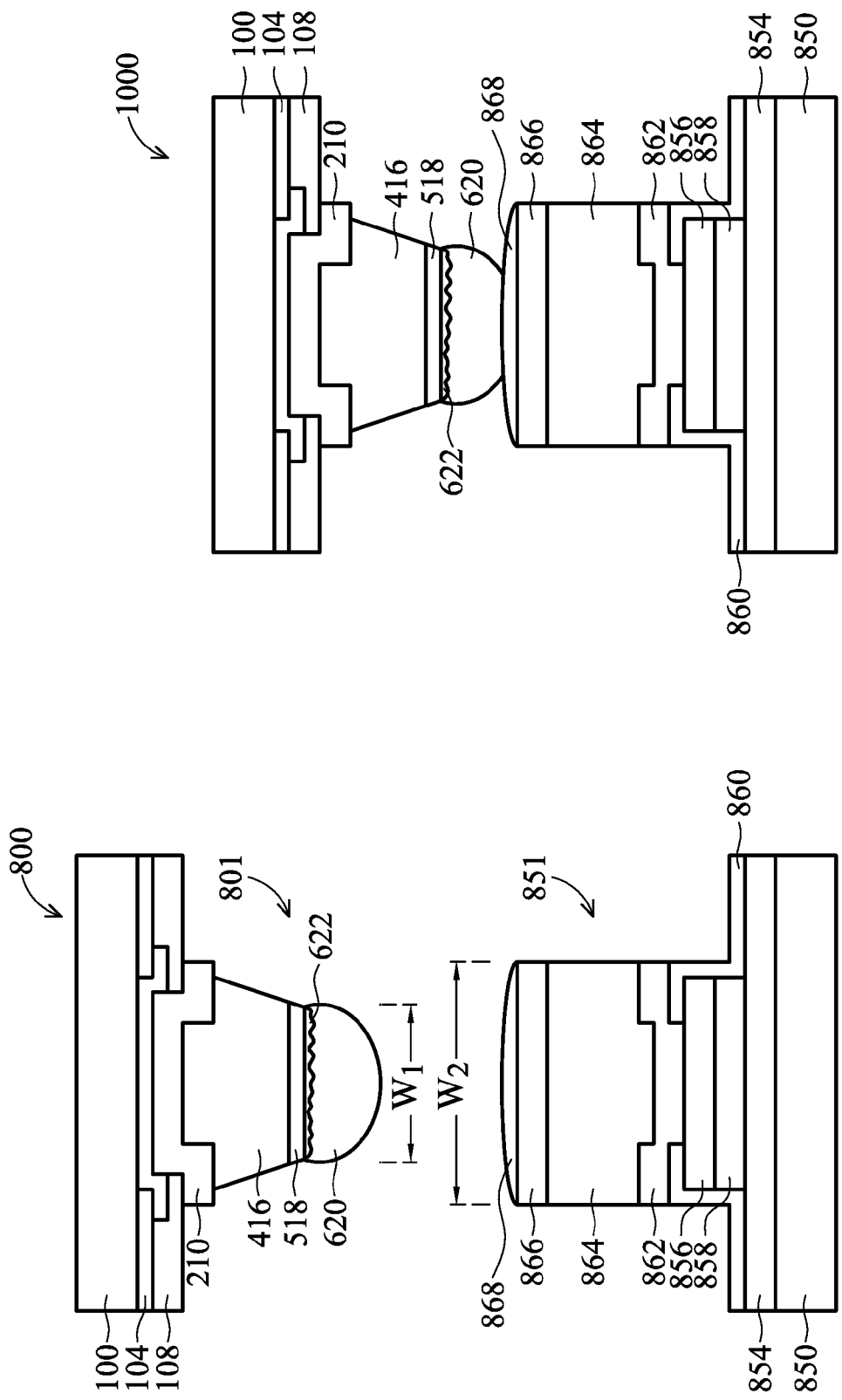

SUBSTRATE INTERCONNECTIONS HAVING DIFFERENT SIZES

This application is a continuation of U.S. patent application Ser. No. 12/784,266, filed on May 20, 2010, entitled "Substrate Interconnections having Different Sizes," which application is hereby incorporated herein by reference in its entirety.

BACKGROUND

Since the invention of the integrated circuit, the semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D integrated circuit (IC) formation, there are physical limits to the density that can be achieved in two dimensions. One of these limits is the minimum size needed to make these components. Also, when more devices are put into one chip, more complex designs are required.

In an attempt to further increase circuit density, three-dimensional (3D) ICs have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate. This attempt, however, requires a carrier substrate larger than the dies for the wire bonding.

More recent attempts have focused on flip-chip interconnections and the use of conductive balls/bumps to form a connection between the die and the underlying substrate, thereby allowing high-wiring density in a relatively small package. In this situation, a conductive bump is formed on one surface and direct contact is made with a post or pad on the other surface. Misalignment, however, often occurs between the contacts on the opposing surfaces. The misalignment may result in shorts between contacts and/or damage to the devices.

Furthermore, the difference in materials and the respective coefficient of thermal expansion (CTE) values creates stress in the joint region. The stress may cause the joint to crack and/or cause other problems, such as delamination issues of the dielectric layers.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 8 and 9 illustrate attaching two substrates in accordance with an embodiment;

DETAILED DESCRIPTION

The making and using of embodiments are discussed in detail below. It should be appreciated, however, that this disclosure provides many applicable inventive concepts that can be embodied in a wide variety of specific contexts. The specific embodiments discussed herein are merely illustrative of specific ways to make and use the embodiments, and do not limit the scope of the disclosure.

Embodiments described herein relate to the use of bumps or balls (collectively referred to herein as bumps) for use with interconnecting one substrate with another substrate, wherein each substrate may be an integrated circuit die, an interposer, packaging substrate, printed circuit board, high-density interconnect, or the like. As will be discussed below, embodiments are disclosed that utilize a bump having a trapezoidal shape. It has been found that embodiments such as those discussed herein may reduce misalignment, thereby increasing throughput and reliability. The intermediate stages of a method for forming a bump are disclosed herein. Embodiments such as these may be suitable for use in three-dimensional (3D) integrated circuit (IC) or stacked die configurations. Throughout the various views and illustrative embodiments, like reference numbers are used to designate like elements.

Figure 1:
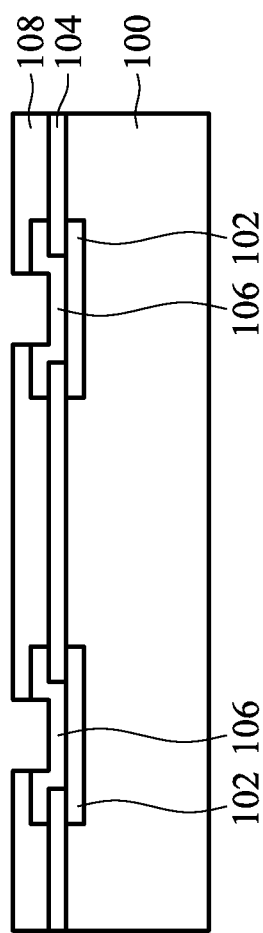
FIGS. 1-7 illustrate intermediate stages in forming a semiconductor device having a bump structure in accordance with an embodiment.

FIGS. 1-7 illustrate various intermediate stages of a method of forming a semiconductor device having a bump with a trapezoidal shape in accordance with an embodiment. Referring first to FIG. 1, a portion of a substrate 100 is shown in accordance with an embodiment. The substrate 100 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as multi-layered or gradient substrates may also be used. In another embodiment, the substrate 100 may comprise a substrate to which an integrated circuit die may be attached. For example, the substrate 100 may be an interposer, a packaging substrate, a high-density interconnect, a printed circuit board, another integrated circuit die, or the like.

It should be noted that in some embodiments, particularly in embodiments in which the substrate 100 is an integrated circuit die, the substrate 100 may include electrical circuitry (not shown). In an embodiment, the electrical circuitry includes electrical devices formed on the substrate 100 with one or more dielectric layers overlying the electrical devices. Metal layers may be formed between dielectric layers to route electrical signals between the electrical devices. Electrical devices may also be formed in one or more dielectric layers. In an embodiment, the substrate 100 includes one or more low-k and/or extremely low-k dielectric layers.

For example, the electrical circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions.

The functions may include memory structures, processing structures, sensors, amplifiers, power distribution circuitry, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

Conductive pads 102 are provided in an upper surface of the substrate 100 to provide external electrical connections. It should be noted that the conductive pads 102 represent an electrical connection to electrical circuitry formed on the substrate 100, an electrical connection to a through-substrate via, a redistribution line, and/or the like. The conductive pads 102 may comprise a conductive material such as copper, although other conductive materials, such as tungsten, aluminum, copper alloy, or the like, may alternatively be used. The conductive pads 102 may be formed using a damascene or dual damascene process which may include a copper overfill into an opening followed by the removal of the excess copper through a process such as chemical mechanical polishing (CMP). However, any suitable material (such as, e.g., aluminum) and any suitable process (such as deposition and etching) may alternatively be used to form the conductive pads 102.

A first passivation layer 104 may be formed of a dielectric material, such as polyimide, polymer, an oxide, a nitride, or the like, and patterned over the surface of the substrate 100 to provide an opening over the conductive pads 102 and to protect the underlying layers from various environmental contaminants. In an embodiment, the first passivation layer 104 comprises a composite layer of a layer of silicon nitride and an oxide layer. The silicon nitride layer may be formed using CVD techniques using silane and ammonia as precursor gases to a thickness of about 750 Å. The oxide layer may be formed by any oxidation process, such as wet or dry thermal oxidation in an ambient comprising an oxide, $H_2O$, NO, or a combination thereof, or by CVD techniques using tetra-ethyl-ortho-silicate (TEOS) and oxygen as a precursor. In an embodiment, the oxide layer has a thickness about 8,500 Å. Other materials, processes, and thicknesses may be used.

In an embodiment in which the first passivation layer 104 comprises a silicon nitride layer and an oxide layer, an opening may be formed exposing the conductive pads 102 using a wet etch process using phosphoric acid to etch the silicon nitride layer and a wet etch process in dilute hydrofluoric acid to etch the silicon dioxide.

Thereafter, bond pads 106 are formed and patterned over the first passivation layer 104. The bond pads 106 provide an electrical connection upon which a UBM structure may be formed for external connections in subsequent processing steps. The bond pads 106 may be formed of any suitable conductive material, such as copper, tungsten, aluminum, silver, combinations thereof, or the like.

One or more second passivation layers, such as a second passivation layer 108, are formed and patterned over the bond pads 106 as illustrated in FIG. 1. The second passivation layer 108 may be formed of a dielectric material, such as polymer, a nitride, an oxide, or the like, by any suitable method, such as CVD, physical vapor deposition (PVD), or the like. In an embodiment, the second passivation layer 108 is a composite layer comprising a plasma-enhanced silicon oxynitride (PESION) layer having a thickness of about 300 Å, an undoped silicate glass (USG) layer having a thickness of about 4,000 Å, and a plasma-enhanced silicon nitride (PESIN) layer having a thickness of about 6,000 Å.

One of ordinary skill in the art will appreciate that a single layer of conductive/bond pads and a passivation layer are shown for illustrative purposes only. As such, other embodiments may include any number of conductive layers and/or passivation layers. Furthermore, it should be appreciated that one or more of the conductive layers may act as a redistribution layer (RDL) to provide the desired pin or ball layout.

Any suitable process may be used to form the structures discussed above and will not be discussed in greater detail herein. As one of ordinary skill in the art will realize, the above description provides a general description of the features of the embodiment and that numerous other features may be present. For example, other circuitry, liners, barrier layers, under-bump metallization configurations, and the like, may be present. The above description is meant only to provide a context for embodiments discussed herein and is not meant to limit the disclosure or the scope of any claims to those specific embodiments.

Figure 2:
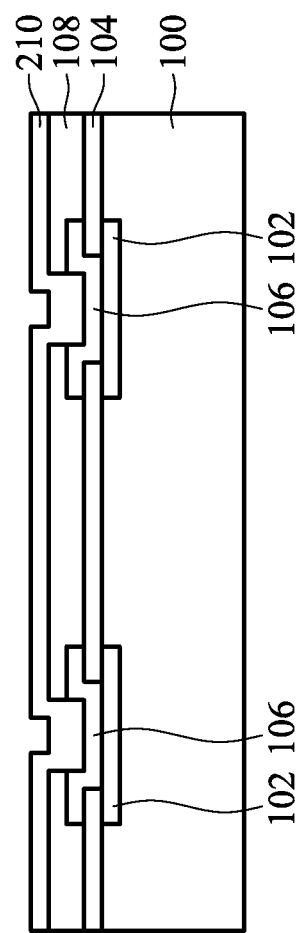

Referring now to FIG. 2, a conformal seed layer 210 is deposited over the surface of the second passivation layer 108 and the exposed portions of the bond pads 106. The seed layer 210 is a thin layer of a conductive material that aids in the formation of a thicker layer during subsequent processing steps. In an embodiment, the seed layer 210 may be formed by depositing a thin conductive layer, such as a thin layer of Cu, Ti, Ta, TiN, TaN, or the like, using CVD or PVD techniques. For example, in an embodiment, the seed layer 210 is a composite layer including a layer of Ti is deposited by a PVD process to a thickness of about 500 Å and a layer of Cu deposited by a PVD process to a thickness of about 3,000 Å. Other materials, processes, and thicknesses may be used.

Figure 3:
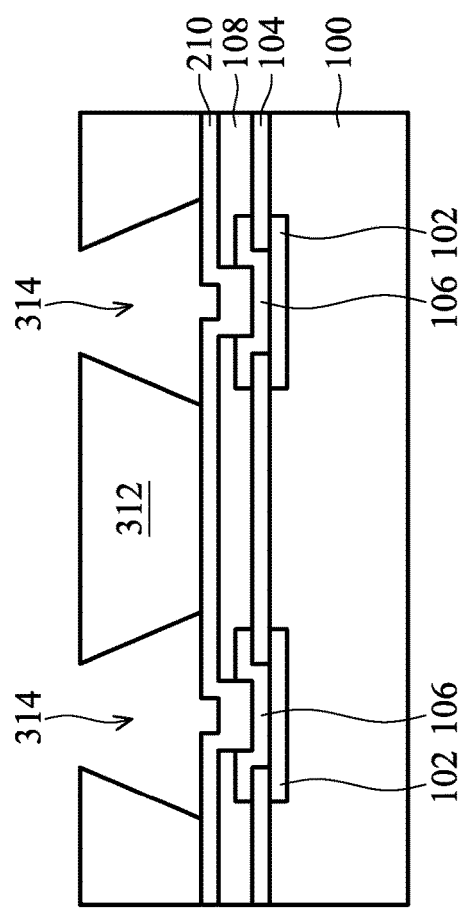

FIG. 3 illustrates a first patterned mask 312 formed over the seed layer 210 in accordance with an embodiment. The first patterned mask 312 will act as a mold for forming conductive pillars in subsequent processing steps. The first patterned mask 312 may be a patterned photoresist mask, hard mask, or the like. In an embodiment, a photoresist material is deposited and patterned to form openings 314.

It should be noted that the embodiment illustrated in FIG. 3 utilizes sloped sidewalls such that the openings 314 are wider along the bottom of the openings along the seed layer 210 than the top portion of the openings 314, thereby resulting in a trapezoidal shape. The tapered profile may be created by any suitable technique, such as the use of multiple photoresist layers with different patterning properties and one or more exposures, diffusion techniques, an image reversal process, multiple exposures using different masks, or the like.

Figure 4:
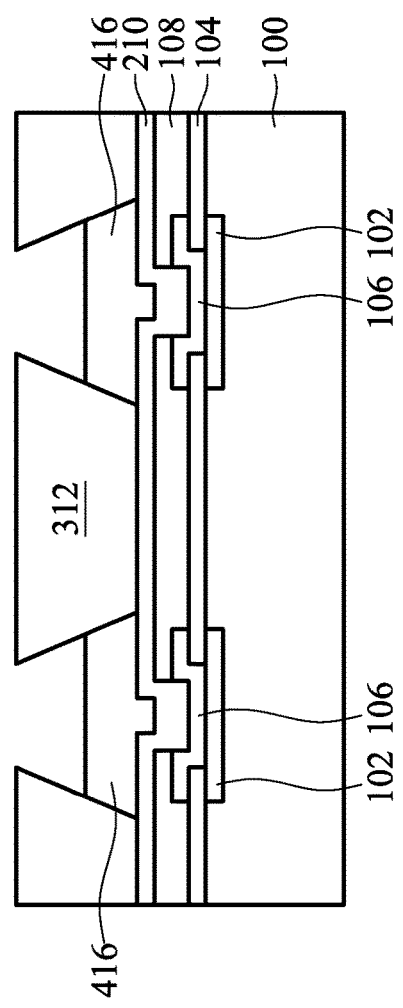

Thereafter, conductive pillar 416 is formed in the openings 314 (see FIG. 3) as illustrated in FIG. 4. The conductive pillar 416 comprises one or more conductive materials, such as copper, tungsten, other conductive metals, or the like, and may be formed, for example, by electroplating, electroless plating, or the like. In an embodiment, an electroplating process is used wherein the wafer is submerged or immersed in the electroplating solution. The wafer surface is electrically connected to the negative side of an external DC power supply such that the wafer functions as the cathode in the electroplating process. A solid conductive anode, such as a copper anode, is also immersed in the solution and is attached to the positive side of the power supply. The atoms from the anode are dissolved into the solution, from which the cathode, e.g., the wafer, acquires, thereby plating the exposed conductive areas of the wafer, e.g., exposed portions of the seed layer 210 within the openings 314.

Figure 5:
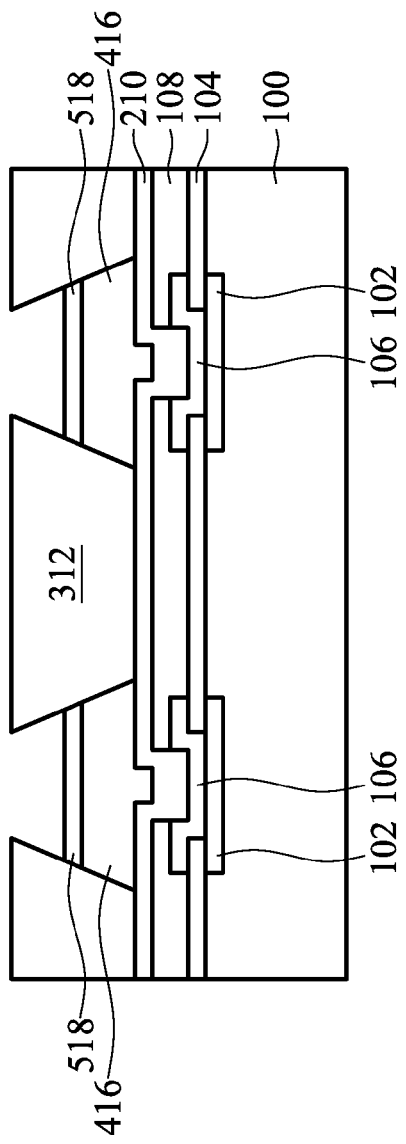

FIG. 5 illustrates formation of an optional conductive cap layer 518 formed over the conductive pillar 416. As described in greater detail below, solder material will be formed over the conductive pillar 416. During the soldering process, an inter-metallic compound (IMC) layer is naturally formed at the joint between the solder material and the underlying surface. It has been found that some materials may create a stronger, more durable IMC layer than others. As such, it may be desirable to form a cap layer, such as the conductive cap layer 518, to provide an IMC layer having more desirable characteristics. For example, in an embodiment in which the conductive pillar 416 is formed of copper, a conductive cap layer 518 formed of nickel may be desirable. Other materials, such as Pt, Au, Ag, combinations thereof, or the like, may also be used. The conductive cap layer 518 may be formed through any number of suitable techniques, including PVD, CVD, ECD, MBE, ALD, electroplating, and the like.

Figure 6:
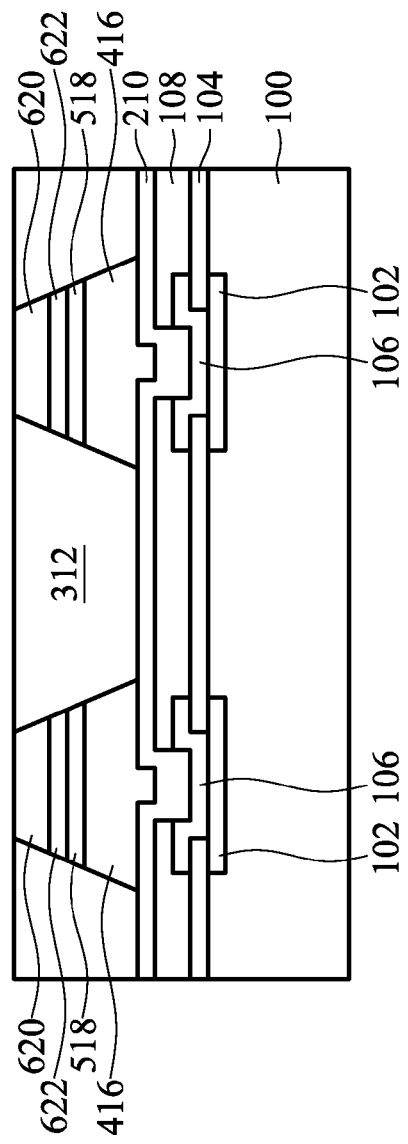

FIG. 6 illustrates formation of solder material 620 and an IMC layer 622. In an embodiment, the solder material 622 comprises SnPb, a high-Pb material, a Sn-based solder, a lead-free solder, or other suitable conductive material.

Figure 7:
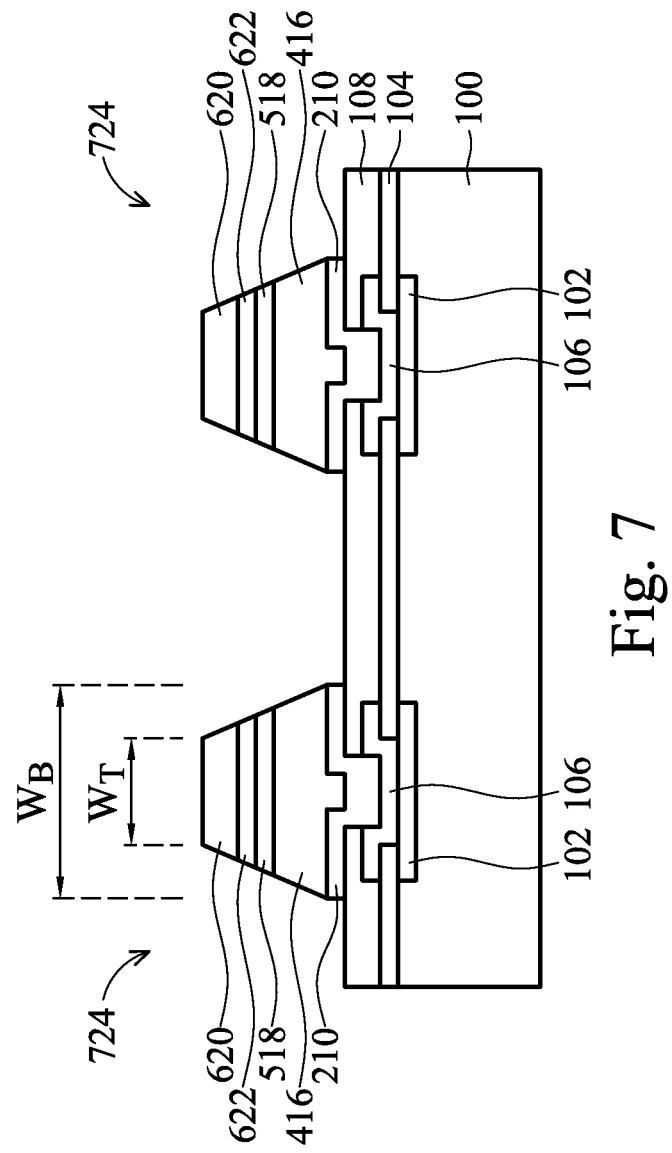

FIG. 7 illustrates the removal of the first patterned mask 312 (see FIG. 3) in accordance with an embodiment. In an embodiment in which the first patterned mask 312 is a photoresist mask, a plasma ashing or wet strip process may be used to remove the first patterned mask 312. One suitable plasma ashing process uses an $O_2$ flow rate of about 1000 sccm to about 2000 sccm at a pressure of about 300 mTorr to about 600 mTorr and at power of about 500 Watts to about 2000 Watts and at a temperature of about 80° C. to about 200° C., for example. The exposed portions of the seed layer 210 may be removed by, for example, a wet etching process. Optionally, a wet dip in a sulfuric acid ($H_2SO_4$) solution may be used to clean the wafer and remove remaining photoresist material. A reflow process may be performed, which may cause the solder material 620 to have a rounded shape.

The conductive pillar 416 and, optionally, the conductive cap layer 518 form a conductive bump 724 having a trapezoidal shape such that sidewalls of the conductive bump 724 are tapered. In this situation, a width of the base portion $W_B$ is greater than a width of the tip portion $W_T$. The relatively wide base dimension may reduce current density and the narrower top portion may reduce the probability of misalignment when coupling the first substrate 100 to another substrate.

FIGS. 8-9 illustrate joining two substrates in accordance with an embodiment. The first substrate 800, having a first interconnect structure 801, represents a substrate such as the substrate 100 discussed above with reference to FIGS. 1-7, wherein like reference numerals refer to like elements. The second substrate 850 represents a substrate to be attached to the first substrate 800 and may be an integrated circuit die, an interposer, a packaging substrate, a high-density interconnect, a printed circuit board, or the like.

For purposes of illustration, the second substrate 850 illustrates an example of a second interconnect structure 851 that may be used for attaching to the first substrate 800. It should be noted, however, that other types of interconnect structures may be utilized to join the first substrate 800 to the second substrate 850. In this example, the second substrate 850 comprises a first passivation layer 854 formed of one or more dielectric layers, such as polyimide, polymer, an oxide, a nitride, and/or the like. In an embodiment, the first passivation layer 854 comprises a composite layer of a layer of silicon nitride having a thickness of about 2,000 Å with an overlying oxide layer having a thickness of about 10,000 Å. The silicon nitride layer may be formed using CVD techniques using silane and ammonia as precursor gases, and the oxide layer may be formed by any oxidation process, such as wet or dry thermal oxidation in an ambient comprising an oxide, $H_2O$, NO, or a combination thereof, or by CVD techniques using TEOS and oxygen as a precursor.

A conductive pad 856 is formed over the first passivation layer 854. The conductive pad 856 may be formed of any suitable conductive material, such as copper, tungsten, aluminum, silver, combinations thereof, or the like. It should be noted that the conductive pad 856 may be a portion of redistribution layer or a through-substrate via. In an embodiment, the conductive pad 856 may be formed using a similar process as discussed above to form conductive pillar 416. For example, a conformal seed layer 858 comprising a layer of titanium having a thickness about 500 Å and a layer of copper having a thickness about 3,000 Å may be formed over the first passivation layer 854. A mask layer may be formed an patterned to define the shape of the conductive pad 856, after which a electroplating process may be used to form a layer of copper having a thickness of about 3 µm to form the conductive pad 856. The mask layer and the excess seed layer may be removed.

Other methods and materials may be used. For example, formation methods may include ECP, electroless plating, or other commonly used deposition methods such as sputtering, printing, and CVD methods, and the conductive materials may include copper alloys, aluminum, silver, gold, combinations thereof, or the like.

One or more second passivation layers, such as a second passivation layer 860, are formed and patterned over the conductive pad 856 as illustrated in FIG. 8. The second passivation layer 860 may be formed of a dielectric material, such as polymer, an oxide, a nitride, or the like, by any suitable method, such as CVD, PVD, or the like. In an embodiment, the second passivation layer 860 comprises a silicon nitride layer having a thickness of about 4,000 Å formed by CVD techniques.

Thereafter, a seed layer 862, a conductive pillar 864, a conductive cap layer 866, and a solder layer 868 are formed on the conductive pad 856. The seed layer 862, the conductive pillar 864, the conductive cap layer 866, and the solder layer 868 may be formed of similar materials using similar techniques as those discussed above with reference to the seed layer 210, the conductive pillar 416, the conductive cap layer 518, and the solder layer 620, respectively. It should be noted, however, that the conductive pillar 864 and the conductive cap layer 866 on the second substrate 850 has a rectangular profile, as opposed to the trapezoidal profile of the conductive bump 416 and the conductive cap layer 518. It should also be noted that the solder layer 868 is a relatively thin solder layer to allow for better connectivity between the first substrate 800 and the second substrate 850 and may reduce or prevent misalignment. An IMC layer 870 may be formed between the solder layer 868 and the cap layer 866.

FIG. 9 illustrates the first substrate 800 and the second substrate 850 after attachment. As illustrated in FIG. 8, a first width $W_1$ of a contact surface of the first interconnect structure 801 of the first substrate 800 is less than a second width $W_2$ of a contact surface of the second interconnect structure 851 of the second substrate 850. In an embodiment, a ratio of the first width $W_1$ to the second width $W_2$ ($W_1/W_2$) is greater than or equal to 0.1 and less than 1.0.

Figure 10:
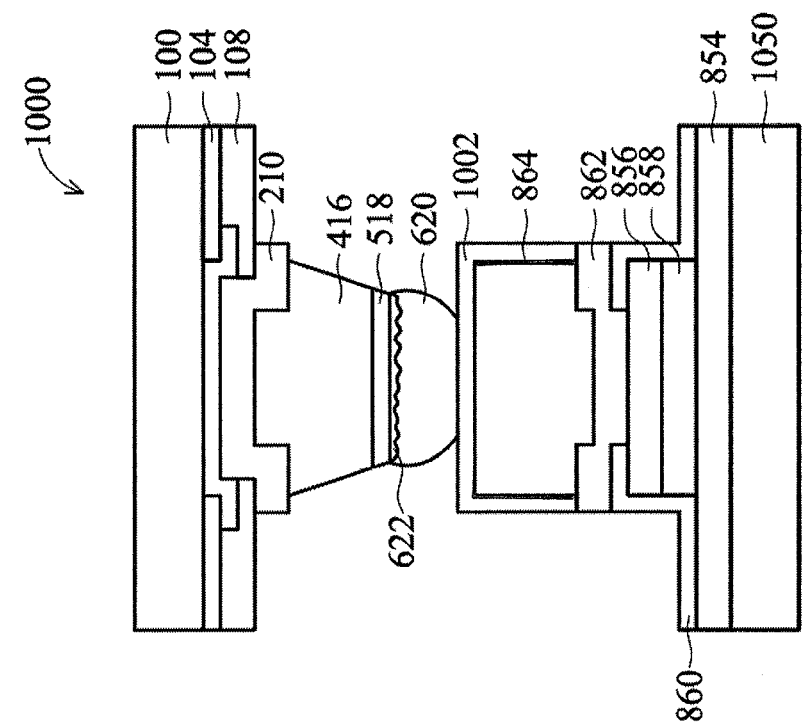
FIGS. 10 and 11 illustrate attaching two substrates in accordance with another embodiment.
Figure 11:
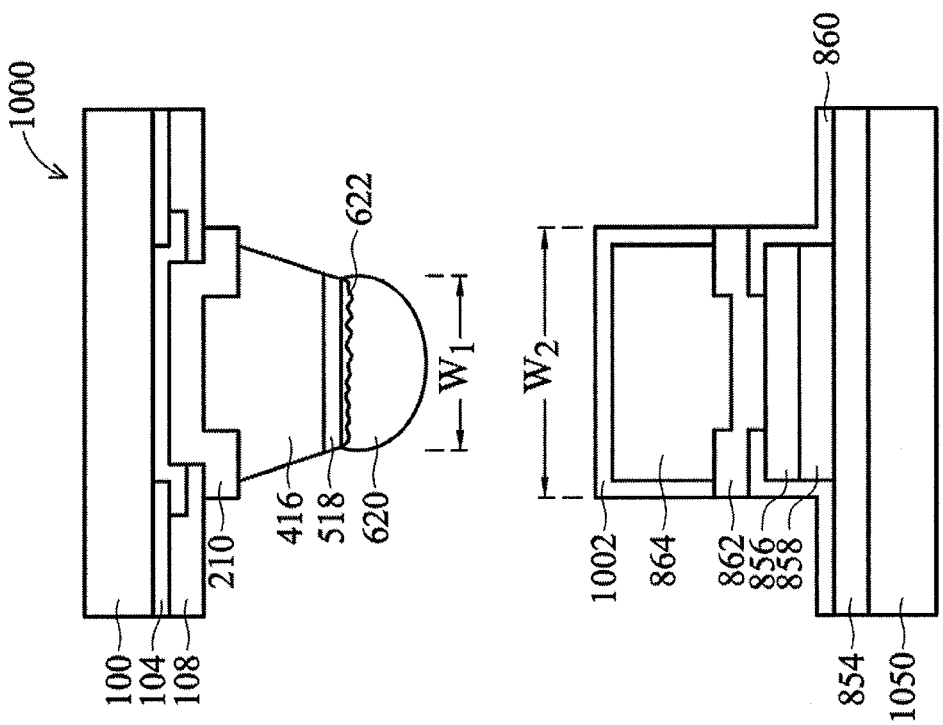

FIGS. 10 and 11 illustrate another embodiment in which two substrates are joined. A first substrate 1000 having a first interconnect structure 1001 represents a substrate such as the substrate 100 discussed above with reference to FIGS. 1-7, wherein like reference numerals refer to like elements. A second substrate 1050 represents a substrate to be attached to the first substrate 1000 via a second interconnect structure 1051 and may be an integrated circuit die, an interposer, a packaging substrate, a high-density interconnect, a printed circuit board, or the like.

The second substrate 1050 illustrated in FIGS. 10 and 11 may be formed of similar materials using similar techniques as those discussed above with reference to the second substrate 850 of FIG. 8, wherein like reference numerals refer to like elements, except the second substrate 1050 omits the conductive cap layer 866 and the solder layer 868. Furthermore, the embodiment illustrated in FIGS. 10 and 11 utilize a finish layer 1002 extending over the top surface and the sidewalls of the conductive pillar 864. In an embodiment, the finish layer 1002 includes nickel layer directly on, and contacting, the conductive pillar 864. Optionally, additional layers may be formed, so that the finish layer 1002 may be an electroless nickel immersion gold (ENIG), a nickel electroless palladium immersion gold (ENEPIG), or a nickel palladium layer. The formation methods of finish layer 1002 include ECP, electroless plating, and the like. FIG. 11 illustrates the first substrate 1000 and the second substrate 1050 after attachment.

Figure 12:
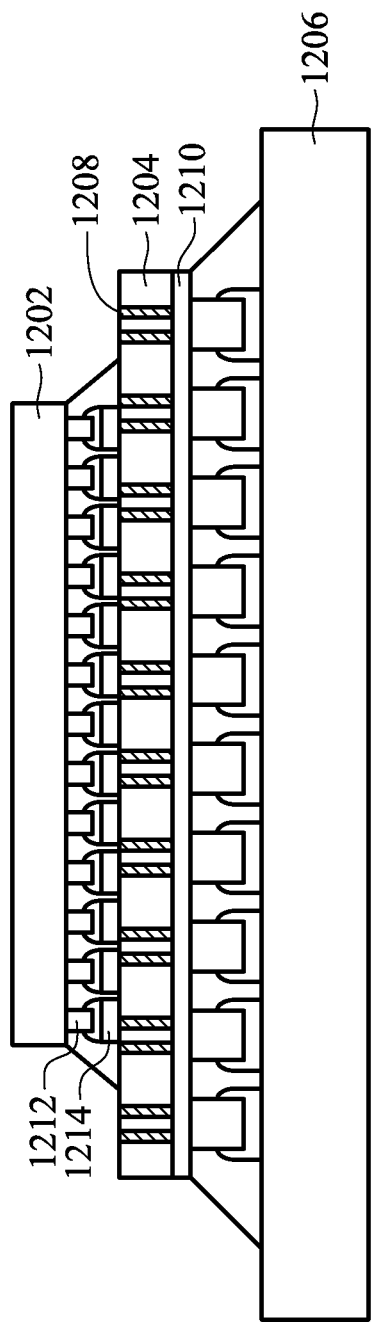
FIG. 12 illustrates a through transition stacking arrangement in accordance with an embodiment.
Figure 13:
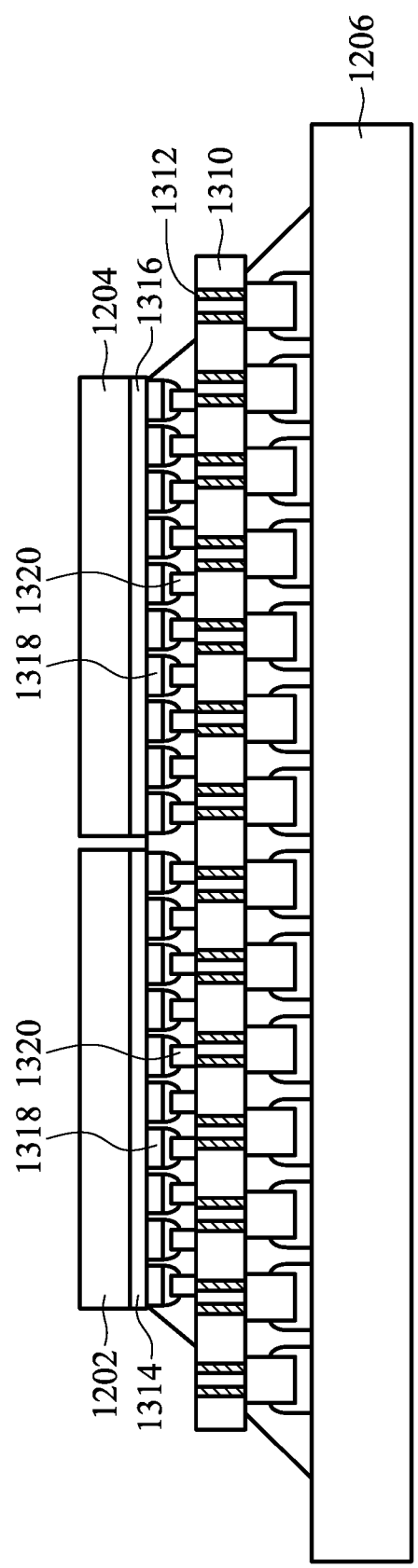
FIG. 13 illustrates a through interposer stacking arrangement in accordance with an embodiment.

FIGS. 12 and 13 illustrate a through transition stacking (TTS) arrangement and a through interposer stacking (TIS) arrangement, respectively, in accordance with embodiments. Generally, the TTS arrangement illustrated in FIG. 12 comprises a first integrated circuit die 1202 and a second integrated circuit die 1204, such that the first integrated circuit die 1202 is attached to the second integrated circuit die 1204, which in turn is attached to a substrate 1206. Through-substrate vias 1208 in the second integrated circuit die 1204 provide an electrical connection between the first integrated circuit die 1202 and contacts on the bottom side of the second integrated circuit die 1204. The first integrated circuit die 1202 and the second integrated circuit die 1204 may be any suitable integrated circuit die. In an embodiment, the first integrated circuit die 1202 is a memory die and the second integrated circuit die 1204 is a logic die, though other dies and combinations may be used.

In the embodiment illustrated in FIG. 12, the second integrated circuit die 1204 is attached to the substrate 1206, which may be a printed circuit board, an interposer, a laminate substrate, a packaging substrate, or the like. In yet another embodiment, the substrate 1206 may be a third integrated circuit die, thereby resulting in a stacked die configuration of three dies.

FIG. 12 also illustrates an embodiment in which the larger of the contact surfaces of the interconnect structures being joined together is positioned on the bottom die. For example, the first integrated circuit die 1202 may have a first interconnect structure 1212 having a width of $W_1$ (see, e.g., FIGS. 8-11) while the second integrated circuit die 1204 may have a second interconnect structure 1214 having a larger width $W_2$ (see, e.g., FIGS. 8-11).

FIG. 12 further illustrates an embodiment in which one of the substrates, e.g., the second integrated circuit die 1204, includes an extremely low-k (ELK) dielectric film 1210, wherein the ELK dielectric film has a dielectric constant less than or equal to about 2.5. In embodiments such as these that utilize ELK dielectric films, it may be desirable to position the interconnect structure having a larger width on the substrate having the ELK dielectric film. It is believed that placing the interconnect structure with the larger width on the substrate having the ELK dielectric film may reduce the joint stress, which in turn may reduce delamination issues related to the joint stress. Thus, in the embodiment illustrated in FIG. 12, the second integrated circuit die 1204 would have the interconnect structure having the larger width. With reference to FIGS. 10 and 11, the second integrated circuit die 1204 may have the interconnect structure having the width $W_2$, while the substrate 1206 to which the second integrated circuit die 1204 is connected would have the interconnect structure having the width $W_1$, wherein $W_2$ is greater than $W_1$.

FIG. 13 illustrates an embodiment similar to the embodiment illustrated in FIG. 12, wherein like reference numerals refer to like elements, except that an interposer 1310 is used. In this embodiment, the first integrated circuit die 1202 and the second integrated circuit die 1204 are attached to the interposer 1310, which in turn is attached to the substrate 1206. Through-substrate vias 1312 in the interposer 1310 provide an electrical connection between the first integrated circuit die 1202, the second integrated circuit die 1204, and/or the substrate 1206.

It should be appreciated that any of the connections used between the first integrated circuit die 1202, the second integrated circuit die 1204, the substrate 1206, and/or the interposer 1310 may utilize a tapered conductive element as discussed above.

FIG. 13 also illustrates an embodiment in which the first integrated circuit die 1202 and the second integrated circuit die 1204 includes ELK films 1314 and 1316, respectively. As discussed above, in embodiments in which ELK films are being used, it is believed that placing the larger of the interconnect structures being joined together on the substrate having the ELK films may reduce the delamination issues of the ELK films related to the joint stress. Thus, the first integrated circuit die 1202 and the second integrated circuit die 1204 may have interconnect structures 1318 having the width $W_2$ (see, e.g., FIGS. 8-11), while the interposer 1310 to which the first integrated circuit die 1202 and the second integrated circuit die 1204 are connected would have an interconnect structure 1320 having the width $W_1$ (see, e.g., FIGS. 8-11), wherein $W_2$ is greater than $W_1$.

In accordance with an embodiment, a device having a first substrate connected to a second substrate is provided, wherein the contact surfaces of the first substrate and the second substrate have different widths. In an embodiment, one of the first substrate and the second substrate may have a conductive pillar such that the conductive pillar has a trapezoidal shape or a shape having tapered sidewalls. The conductive pillar may include a cap layer. The substrates may each be an integrated circuit die, an interposer, a printed circuit board, a high-density interconnect, or the like.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method comprising:
forming a patterned mask on a first substrate, the first substrate having a bond pad, an opening being through the patterned mask to the bond pad, the opening having first tapered sidewalls such that a width of the opening narrows as the opening extends away from the first substrate;
forming a pillar on the bond pad and in the opening, the pillar having second tapered sidewalls, the second tapered sidewalls conforming to and adjoining the first tapered sidewalls;
forming a solder layer on the pillar and in the opening;
forming a first interconnect structure on the first substrate;
after forming the solder layer, removing the patterned mask from the first substrate; and
attaching the first interconnect structure to a second interconnect structure on a second substrate using, at least in part, the solder layer.

2. The method of claim 1, further comprising forming a cap layer on the pillar and in the opening, the solder layer being formed on the cap layer on the pillar.

3. The method of claim 1 further comprising attaching the first substrate to a second substrate by reflowing the solder layer to attach the pillar on the first substrate to an interconnect structure on the second substrate.

4. The method of claim 3, wherein the first substrate is a first integrated circuit die, and the second substrate is a second integrated circuit die.

5. The method of claim 3, wherein the first substrate is an integrated circuit die, and the second substrate is an interposer.

6. The method of claim 1, wherein the pillar is part of the first interconnect structure on the first substrate, the first interconnect structure having a first width at a location distal from the first substrate, and further comprising attaching the first interconnect structure to a second interconnect structure of a second substrate by a solder joint, the attaching comprising reflowing the solder layer to form, at least in part, the solder joint, the second interconnect structure having a second width at a location distal from the second substrate, the second width being greater than the first width.

7. The method of claim 1 further comprising:
forming a cap layer on the pillar and in the opening, wherein the first interconnect structure on the first substrate includes the pillar and the cap layer, the solder layer being formed on the cap layer on the pillar.

8. A method comprising:
forming a first interconnect structure of a first substrate, the first interconnect structure extending from a first surface of the first substrate, the first interconnect structure comprising a first conductive pillar and a first conductive cap layer, the first conductive pillar having first sidewalls that taper together as the first sidewalls extend from the first surface of the first substrate, the first conductive pillar having a first distal pillar surface that is distal from the first substrate and that connects to the first sidewalls, the first conductive cap layer being only on the first distal pillar surface of the first conductive pillar, the first conductive cap layer having second sidewalls that taper together as the second sidewalls extend away from the first conductive pillar, wherein the first conductive cap layer is disposed above the first conductive pillar;
forming a second interconnect structure of a second substrate, the second interconnect structure extending from a second surface of the second substrate; and
coupling the first interconnect structure to the second interconnect structure with a reflowed solder joint, wherein material of the reflowed solder joint is wholly disposed above an upper-most surface of the first conductive cap layer.

9. The method of claim 8, wherein the first conductive cap layer has a first width parallel to the first surface of the first substrate at a location distal from the first substrate, and the second interconnect structure has a second width parallel to the second surface of the second substrate at a location distal from the second substrate, the first width being less than the second width.

10. The method of claim 8, wherein the first substrate comprises a first integrated circuit die, and the second substrate comprises a second integrated circuit die.

11. The method of claim 8, wherein the first substrate comprises an integrated circuit die, and the second substrate comprises an interposer.

12. The method of claim 8, wherein forming the second interconnect structure comprises:
forming a conductive pad on the second substrate;
forming a dielectric on sidewalls of the conductive pad and on a distal pad surface that is distal from the second substrate, an opening being through the dielectric to the conductive pad;
forming a second conductive pillar on the conductive pad through the opening and on the dielectric; and
forming a second cap layer only on a second distal pillar surface of the second conductive pillar that is distal from the second substrate.

13. The method of claim 8, wherein forming the second interconnect structure comprises:
forming a conductive pad on the second substrate;
forming a dielectric on sidewalls of the conductive pad and on a distal pad surface that is distal from the second substrate, an opening being through the dielectric to the conductive pad;
forming a second conductive pillar on the conductive pad through the opening and on the dielectric; and
forming a finish layer on a second distal pillar surface of the second conductive pillar that is distal from the second substrate and on sidewalls of the second conductive pillar.

14. A method comprising:
forming a first interconnect structure of a first substrate, the first interconnect structure extending from a first surface of the first substrate, the first interconnect structure having a profile that tapers as the first interconnect structure extends from the first substrate, the first interconnect structure having a first width at a location distal from the first substrate, wherein the first interconnect structure is over the first substrate;
forming a second interconnect structure of a second substrate, the second interconnect structure extending from a second surface of the second substrate, the second interconnect structure having a second width at a location distal from the second substrate, the second width being greater than the first width; and
forming a reflowed solder joint coupling the first interconnect structure to the second interconnect structure, wherein material of the reflowed solder joint is wholly disposed above an upper-most surface of the first interconnect structure.

15. The method of claim 14, wherein forming the first interconnect structure comprises forming a conductive pillar and a conductive cap layer, the conductive pillar having first sidewalls that taper together as the first sidewalls extend from the first surface of the first substrate, the conductive pillar having a distal pillar surface that is distal from the first substrate and that connects to the first sidewalls, the conductive cap layer being only on the distal pillar surface of the conductive pillar, the conductive cap layer having second sidewalls that taper together as the second sidewalls extend away from the conductive pillar.

16. The method of claim 14, wherein the profile is trapezoidal.

17. The method of claim 14, wherein the first substrate comprises a first integrated circuit die, and the second substrate comprises a second integrated circuit die.

18. The method of claim 14, wherein the first substrate comprises an integrated circuit die, and the second substrate comprises an interposer.

19. The method of claim 14, wherein forming the second interconnect structure comprises:

forming a conductive pad on the second substrate;

forming a dielectric on sidewalls of the conductive pad and on a distal pad surface that is distal from the second substrate, an opening being through the dielectric to the conductive pad;

forming a conductive pillar on the conductive pad through the opening and on the dielectric; and forming a cap layer only on a distal pillar surface of the conductive pillar that is distal from the second substrate.

20. The method of claim 14, wherein forming the second interconnect structure comprises:

forming a conductive pad on the second substrate;

forming a dielectric on sidewalls of the conductive pad and on a distal pad surface that is distal from the second substrate, an opening being through the dielectric to the conductive pad;

forming a conductive pillar on the conductive pad through the opening and on the dielectric; and forming a finish layer on a distal pillar surface of the conductive pillar that is distal from the second substrate and on sidewalls of the conductive pillar.

* * * * *